Oct. 13, 1959 J. F. BELL 2,908,814
ULTRA HIGH FREQUENCY CHANNEL STRIP FOR TURRET
TUNER, INCLUDING TUNABLE ELEMENTS
Filed May 28, 1957 2 Sheets-Sheet 1

Inventor
John F. Bell
By John J. Pederson
Attorney

Oct. 13, 1959 J. F. BELL 2,908,814

ULTRA HIGH FREQUENCY CHANNEL STRIP FOR TURRET TUNER, INCLUDING TUNABLE ELEMENTS

Filed May 28, 1957 2 Sheets-Sheet 2

Inventor
John F. Bell
By John J. Pederson
Attorney 2,908,814

ULTRA HIGH FREQUENCY CHANNEL STRIP FOR TURRET TUNER, INCLUDING TUNABLE ELEMENTS

John F. Bell, Wilmette, Ill., assignor to Zenith Radio Corporation, a corporation of Delaware Application May 28, 1957, Serial No. 662,113

1 Claim. (Cl. 250—20)

This invention relates to tuners for ultra-high frequency receivers.

The current expansion of UHF television broadcasting facilities has stimulated the television manufacturing industry to produce inexpensive unitary television tuners that can accommodate these UHF stations as well as the conventional VHF stations. Upon the advent of UHF broadcasting a number of years ago, early efforts to accommodate these stations resulted in the development of special tuners (frequency converters) designed to operate in conjunction with the television receiver. Such tuners were not integrally constructed with the receiver but were supplied as a rather expensive plug-in accessory.

Subsequently, television receiver tuners were developed which incorporated UHF frequency conversion. These tuners employ, generally speaking, either a continuous tuning arrangement to permit reception upon any of the 69 UHF channels or demountable tuning strips for use with turret type tuner devices. The former is expensive in relation to its utility in that a complete UHF tuner is provided whereas but few UHF stations are concentrated within the range of any particular receiver. The latter, however, advantageously couples the flexibility of turret type tuners with the inherent economy of demountable frequency converter strips. Such tuning strips are described and claimed in Patent 2,596,117, issued May 13, 1952, to John F. Bell and assigned to the present assignee. By utilizing a demountable tuning strip, the viewer can easily replace VHF channel strips not utilized with appropriate UHF converter strips and is thereby spared the expense of a separate UHF tuner. Furthermore, the viewer can easily adapt his television receiver to any locale by the simple expedient of adding the requisite frequency conversion strips.

Accordingly, it is a primary object of this invention to provide an improved tuning strip which permits reception of predetermined UHF channels on a conventional television receiver.

It is a further object of this invention to provide an improved tuning strip for converting a desired frequency within the UHF band to a predetermined frequency within the VHF frequency band.

Presently available demountable frequency conversion strips utilize conventional inductive and capacitive reactance elements. Tuning is generally accomplished by utilizing a trimmer type capacitor element. Conventional circuit elements tend to exhibit undesirable operation particularly in the upper reaches of the UHF television band; the finite resistivity, for example, of such conventional elements reduces the Q of the tuned circuit thereby adversely affecting the selectivity and/or insertion loss.

It is therefore another object of this invention to provide a demountable UHF frequency conversion tuning strip which provides improved selectivity as compared with previously available UHF tuning strips.

It is a further object of this invention to provide an inexpensive UHF tuning strip for use with the conventional turret tuning device.

A current available tuner strip of a type alluded to above comprises in general a source of oscillatory energy coupled to a multiplier circuit to develop a heterodyning signal for application to a mixer stage. This signal and a received UHF signal are subjected to conventional mixer action to provide an intermediate-frequency output signal. The intermediate frequency may conveniently be selected to lie within the VHF range, in which event the IF signal may be amplified and detected in the same manner as conventionally received VHF signals. A number of methods have been used in the aforementioned tuner strips for translating oscillatory energy from the oscillator tuned circuit to a harmonic generator or multiplier circuit. A coupling capacitor of course may be employed to provide a single-ended energy transfer path, while an adjustable degree of coupling can be provided by a conventional trimmer type capacitor. Though amenable to adjustable coupling, the single-ended or unbalanced nature of simple capacitor coupling can produce undesirable circulating ground currents. Such currents create impedance relationships which can develop resonances (low impedance) at or near the oscillatory frequency, tending thereby to produce instability in the oscillator and reduced injection to the multiplier circuit. On the other hand, anti-resonance effects (high impedance) at frequencies near the oscillator frequency can initiate beat frequencies between such frequencies and the oscillator frequency so as to produce a discernable distortion, e.g., a herring-bone pattern on the image-reproducing device.

It is therefore a prime objective of this invention to provide a UHF tuning strip comprising a novel network for coupling the heterodyning signal to the frequency multiplier circuit in which resonances in the coupling circuit are controlled and utilized to provide more efficient harmonic generation.

In accordance with the invention a tuning strip for selectively tuning a receiver to a predetermined ultra high frequency comprises a support member, a conductive housing fixed to that member and serving as a plane of reference potential, and a tuned preselector circuit mounted on the housing and tuned to a predetermined frequency. A heterodyning signal source including a tuned circuit is also mounted on the housing. At least one of the tuned circuits comprises an elongated conductor having a length and a width much greater than its thickness and formed into a single turn coil with the end surfaces of the conductor disposed in an overlapping spaced parallel relation with respect to one another and with respect to one surface of the housing. A layer of insulating material is interleaved between surfaces of the coil turn and the housing. A connection extends from the innermost one of the overlapping conductor surfaces to the housing so that the conductor and the housing conjointly define an inductor plus a pair of parallel connected tuning condensers. Means are provided for varying the spacing of the conductor surfaces to tune the inductor. Means disposed on the support member are coupled to the preselector circuit and to the heterodyning source for developing an intermediate frequency signal and an output circuit is coupled to this last-mentioned means in order to supply the intermediate frequency signal to a utilizing device.

The features of the present invention which are believed to be novel are set forth with particularity in the appended claims. The organization and manner of operation of the invention, together with further objects and advantages thereof, may best be understood by reference to the following description taken in connection with the accompanying drawings, in the several figures of which like reference numerals identify like elements, and in which:

Figures 1, 2:
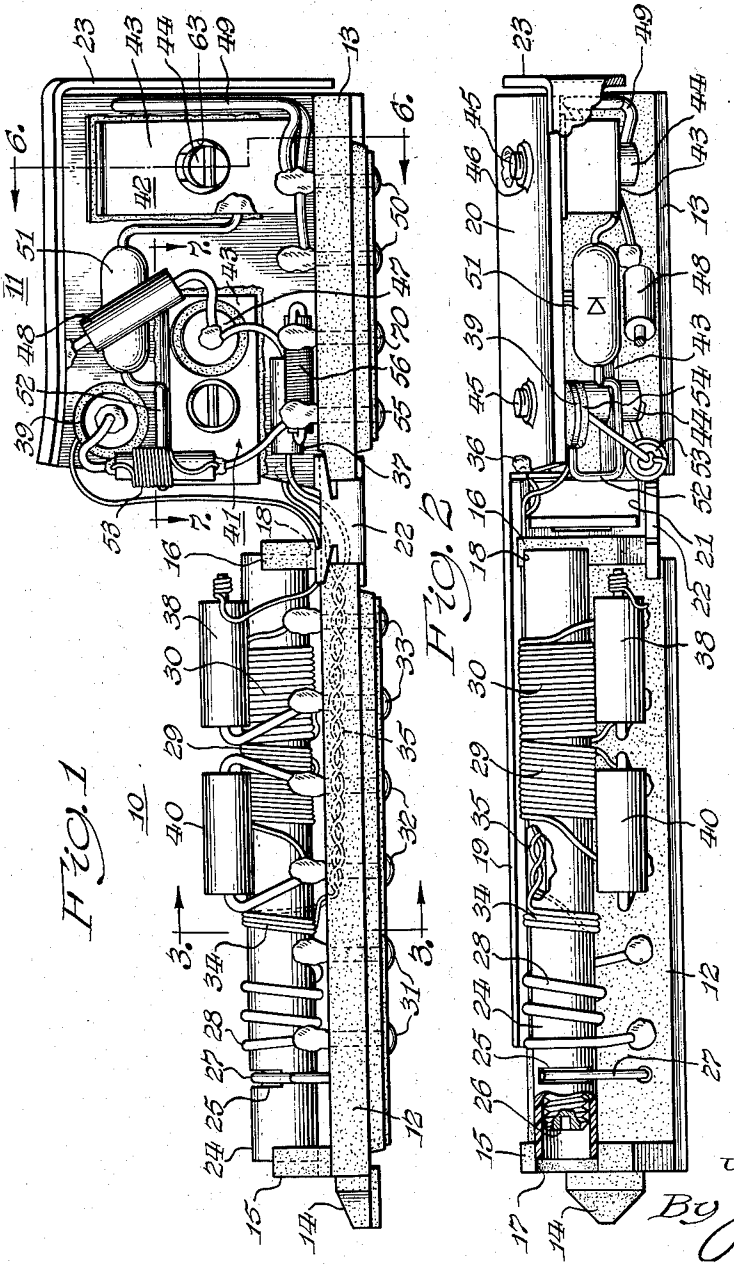
Figure 1 is an elevation view of a tuning strip embodying the subject invention.
Figure 2 is a plan view of the tuning strip shown in Figure 1.

Figures 1 and 2 illustrate a tuning strip embodying the subject invention which strip comprises a coil form assembly 10 and a conductive housing section 11. Assembly 10 and housing 11 are disposed upon the respective support members 12, 13 comprised of an insulating material, e.g., alkyd resin. Support member 12 includes a tongue 14 and the pedestals 15, 16 which include respective relieved portions 17, 18 for mounting coil form assembly 10.

Housing 11 comprises a base 19 having an upright portion 20. Base 19 further includes an aperture 21 and a pre-formed bracket 22 while upright portion 20 maintains a shield element 23. Support members 12, 13 are mounted on base 19 and secured thereto by bracket 22 and by conventional rivet fasteners (not shown). Tongue 14 in conjunction with aperture 21 in base 19 permits mounting the tuning strip upon a conventional television receiver turret tuner (not shown).

Assembly 10 comprises the elongated coil form 24 having a cutout portion 25. A ferromagnetic tuning slug 26, of compressed powdered iron or the like, is disposed within form 24 at the end remote from housing 11. A mounting pin 27 anchored to support member 12 engages cutout 25 to captivate tuning slug 26 and thereby secure form 24. An oscillator coil 28, a converter grid coil 29, and an RF plate coil 30 are coaxially wound upon form 24 and are connected to contact terminal pairs 31, 32, 33 respectively, which are affixed to support member 12. A presettable coupling loop 34 is positioned upon form 24 adjacent oscillator coil 28 and can be fixedly secured to form 24 by cement or other suitable means.

Figure 3:
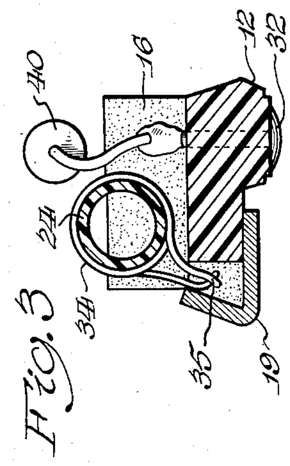
Figure 3 is a cross-sectional view taken along the line 3—3 of Figure 1.

As best shown in Figure 3, coupling loop 34 is terminated by twisted or transposed-lead transmission line 35 extending longitudinally of the strip between support member 12 and base 19 of housing 11. One lead of transmission line 35 is soldered at 36 to upright portion 20 of housing 11 (ground), while the other lead is connected to the anode of a multiplier crystal device 37 located on housing portion 20. The cathode of multiplier crystal 37 is coupled through a capacitor 47 effectively to a tap on an inductance coil 43 of special construction, to be described, which constitutes the inductive element of the multiplier tuned circuit 41.

Coil 30 comprises the plate impedance of an RF amplifier (not shown) and is so positioned upon form 24 as to be inductively coupled to converter grid coil 29. One lead of a resistor 38 is connected to the high potential contact of pair 33, and the other terminal of resistor 38 is coupled to ground (housing portion 20) through a capacitor 39. A resistor 40 parallels coil 29 and is connected in like manner to contact terminal pair 32 to comprise, in conjunction with coil 29, an input circuit to the grid of a conventional television converter stage (not shown).

The conductive housing 11 sustains a multiplier tuned circuit 41 and a tuned preselector circuit 42 each of which circuits includes an elongated conductive element 43 of thin flat sheet material comprising a single-turn inductor. Inductor elements 43 are secured to housing 20 by respective tuning screws 44 of insulating material having threaded shanks 45 which engage correspondingly threaded bosses 46 on housing 20 (Figure 2). Inductor element 43 of circuit 41 may comprise one electrode of capacitor 47; the other electrode of capacitor 47 is returned to ground (shield 23) through a resistor 48. The cathode of crystal device 37 is connected to the junction of capacitor 47 and resistor 48. An antenna coupling loop 49 disposed adjacent preselector circuit 42 is connected to contact terminal pair 50 affixed to support member 13. The cathode of a mixer crystal device 51 is conductively connected to inductor element 43 of preselector circuit 42. The lead 52 from the anode of mixer crystal 51 is positioned adjacent the edge of inductor element 43 of multiplier circuit 41 in coupling loop fashion and is connected to the junction of resistor 38 and capacitor 39. An IF series peaking coil 53 is connected to the same junction through a capacitor 54. The opposite end of coil 53 is returned to a contact terminal 55. A shunt coil 56 is connected between terminal 55 and a terminal 70 which is associated with the VHF antenna coupling circuitry (not shown) of the aforementioned turret tuner.

Figure 4:
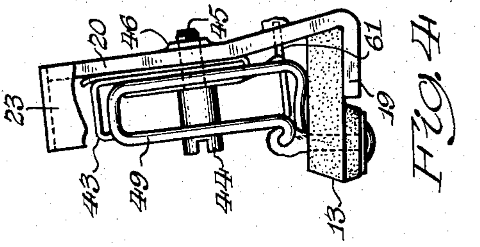
Figure 4 is an end view of the tuning strip shown in Figure 1.

Figure 4, an end view of the tuning strip, reveals the spatial relationship between antenna coupling loop 49 and inductor element 43.

Figure 5:
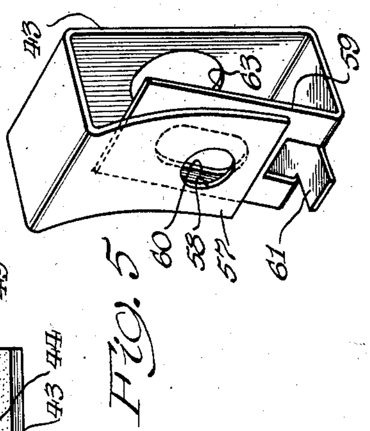
Figure 5 is a perspective view of an elongated inductor element of a tuned circuit of the tuning strip of Figure 1.

Figure 5 is a perspective view of the elongated conductive element 43, the length and width of which are substantially greater than the thickness thereof. Element 43 includes a folded end portion 57 having an aperture 58. A second folded end portion 59 overlaps portion 57 and includes a slotted opening 60. A mounting tab 61 is struck out from portion 59. Folded end portions 57, 59 can comprise the opposed electrodes of a capacitor 62. Element 43 further includes an enlarged aperture 63 in substantial axial alignment with opening 60 and aperture 58 to admit tuning screw 44.

Figure 6:
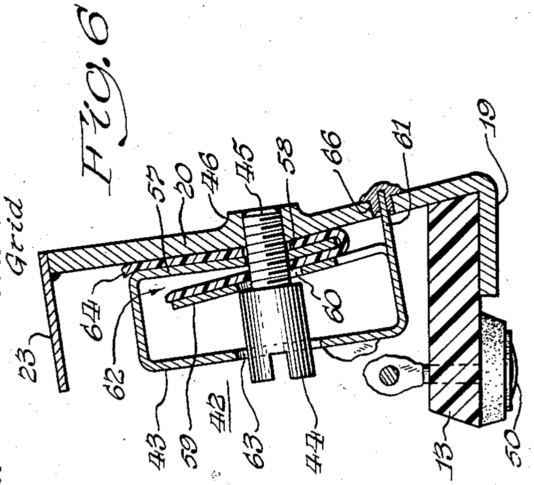
Figure 6 is a cross-sectional view taken along line 6—6 of Figure 1.

Figure 6 comprises a cross-sectional view through housing 20 and illustrates among other features the mounting of inductor element 43 to housing 20 and the manner in which tuning screw 44 engages end portion 59 of capacitor 62. An insulating sheet 64, which can be a thin sheet of plastic material such as those sold under the trademarks Teflon and Mylar, is disposed between housing 20 and end portion 57 of element 43 and further can be introduced between overlapping end portions 57, 59 to comprise a dielectric for capacitor 62. Mounting tab 61 protrudes through a slot 66 in housing 20 and is conductively secured thereto. The cooperative relationship between tuning screw 44, the overlapping end portions 57, 59, and housing 20 which permits varying the capacity of capacitor 62 is readily apparent.

Figure 7:
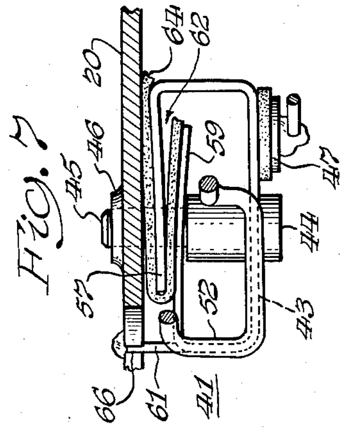
Figure 7 is a cross-sectional view taken along the line 7—7 of Figure 1 illustrating the use of a component lead as a coupling loop; and, Figure 8 is a schematic circuit diagram of the tuning strip of Figure 1.

Figure 7 is more fully illustrative of the manner in which lead 52 of mixer crystal 51 is positioned so as to assume a coupling relationship to inductor element 43 of multiplier circuit 41. The manner of construction which uses element 43 of multiplier circuit 41 as an electrode of capacitor 47 is also clearly shown.

Figure 8:
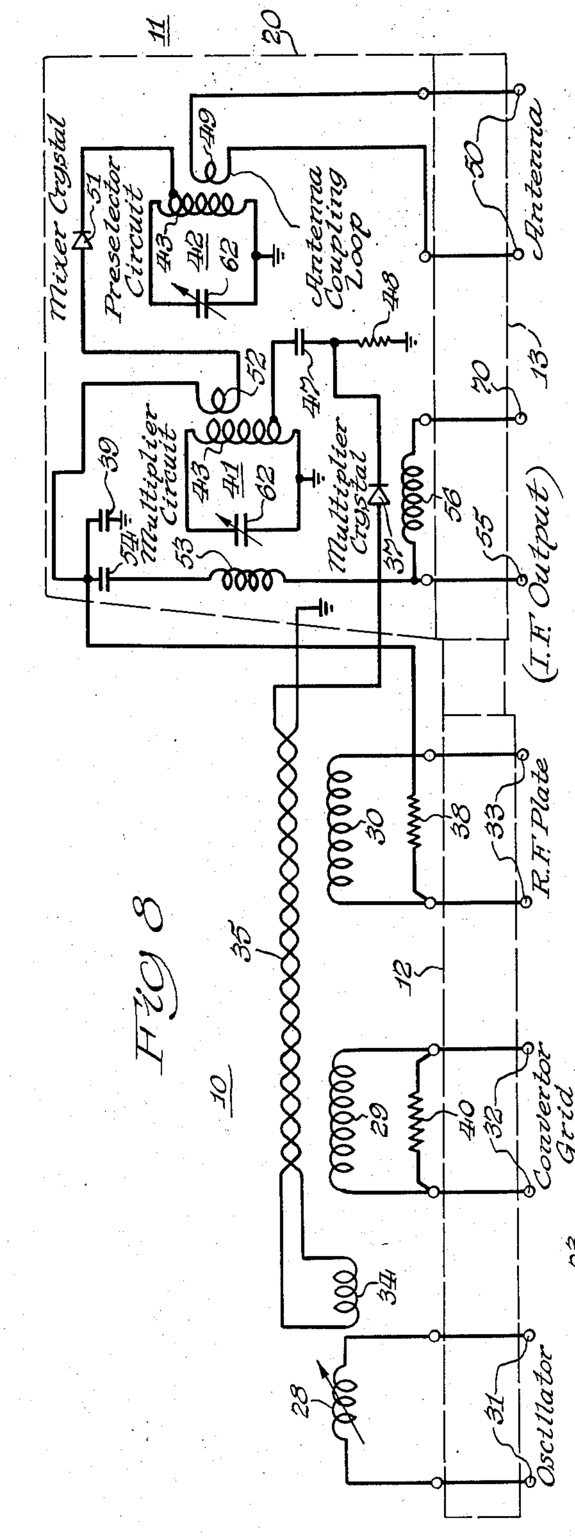

Figure 8 comprises a schematic diagram of the subject tuning strip in which the electrical designations of the various components are so positioned as to correspond substantially to the physical layout of Figures 1 and 2.

In operation, reception of a predetermined UHF channel is determined by first indexing the particular tuning strip to an operative position in a conventional television receiver turret tuner (not shown). The contact terminal pairs 31, 32, 33, 50, and terminals 55 and 70 assume conductive contact with related circuitry of the tuner.

Oscillator coil 28 and tuning slug 26 can determine the frequency of a local oscillator associated with the aforementioned tuner and thus comprise a heterodyning signal source for the tuning strip. Coupling loop 34 being axially displaceable upon form 24 can preset the magnitude of oscillatory energy coupled to transmission line 35 from coil 28. Since one lead of transmission line 35 is directly grounded to housing 20 and the other lead is likewise terminated through capacitor 47, circulating ground currents are minimized. Furthermore, the magnitude of coupling between loop 34 and coil 28 in conjunction with the characteristics and constants of line 35 and coil 28 can be adjusted to preclude undesirable resonant and anti-resonant impedances avoiding herringbone and other distortion patterns in the reproduced image and inefficient frequency multiplication.

Oscillatory energy is thus availed to multiplier crystal 37 which is utilized as a conventional harmonic generator. The harmonic output from crystal 37 is coupled to multiplier circuit 41 through capacitor 47. Resistor 48 comprises a direct current return for multiplier crystal 37. Circuit 41 is tuned to a selected one of the harmonic frequencies generated by crystal 37 by varying the proximity of overlapping end portions 57, 59 of inductor element 43. Inductor element 43 in conjunction with overlapping end portions 57, 59 comprise a high Q tuned circuit. In utilizing a single-turn ribbon like inductor element having a length and width substantially greater than the thickness thus reducing resistivity, the necessarily high Q required of tuned circuits for the ultra-high frequencies is realized. Furthermore with one end of element 43, tab 61, effectively grounded and the other end insulated from housing 20 by sheet 64, no portion of the UHF tuned circuit is in contact with the insulating material of support member 13. This is significant in view of the fact that commonly used insulating materials, such as alkyd resin, present a definite loss at the ultra-high frequencies. The construction utilized by applicant on the other hand obviates any such loss by mounting the tuned circuit 41 upon conductive housing 20.

Having described the operation of multiplier circuit 41 which derives a selected heterodyning signal, attention is directed to preselector circuit 42 which is tuned to be responsive to received UHF signals of the desired frequency. Contact pair 50 is connected to a UHF antenna (not shown). Coupling loop 49, likewise connected to contact terminal pair 50, couples received UHF signals to preselector circuit 42. Preselector circuit 42 being substantially identical in construction and operation to multiplier circuit 41 is tuned in like manner so as to respond to received signals of the predetermined UHF frequency. Mixer crystal 51 is conductively fixed to inductor element 43 of preselector circuit 42 at a point determinative of a desired impedance level. Lead 52 from the cathode of mixer crystal 51 being inductively coupled to the inductor element 43 of multiplier circuit 41 couples selected heterodyning signal energy to the mixer circuit. The proximity of lead 52 to inductor element 43 of the multiplier circuit determines the magnitude of coupling thereto and further permits of simple adjustment.

Accordingly, a selected heterodyning signal derived from multiplier circuit 41 is heterodyned with the predetermined UHF frequency derived from preselector circuit 42 in mixer crystal 51 by conventional heterodyning action. The IF series peaking coil 53 emphasizes a particular IF frequency which can comprise the difference frequency between the selected heterodyning signal and the predetermined UHF frequency. By the judicious selection of the heterodyning frequency, the IF frequency can advantageously be determined within the VHF frequency band and availed to the television receiver tuner via contact terminal 55. The shunt coil 56 improves IF rejection by neutralizing the capacity between the VHF antenna terminal 70 and IF output terminal 55.

Accordingly, the IF output from terminal 55 can be presented to the radio-frequency amplifier of the VHF television tuner. RF coil 30 comprises the plate impedance of the aforementioned RF amplifier and is tuned to the IF output signal at contact 55. Converter coil 29 being tightly coupled to RF plate coil 30 comprises in conjunction with resistor 40 the grid input network of a conventional converter which can be utilized as an IF amplifier. The translated IF signal is thereafter detected and utilized in a conventional manner.

This invention provides a novel and superior performing tuned circuit comprising a single-turn inductor element having overlapping end portions comprising an adjustable capacitor device for use in demountable tuning strips. The construction and configuration of such strips and circuitry permit increased selectivity and furthermore are inexpensive to assemble and are economical in material cost. A tuning strip incorporating the features of this invention can readily provide reception of UHF channels upon a conventional VHF turret type tuner at minimum cost. The subject invention further provides a novel oscillator coupler comprising a presettable loop and a twisted or transposed-lead transmission line which obviates undesirable features of prior art coupling methods and further can be designed to avoid harmful resonant and anti-resonant impedances and adjusted for optimum injection.

While particular embodiments of the invention have been shown and described, it will be obvious to those skilled in the art that changes and modifications may be made without departing from the invention in its broader aspects, and, therefore, the aim in the appended claim is to cover all such changes and modifications as fall within the true spirit and scope of the invention.

I claim:

A tuning strip for selectively tuning a receiver to a predetermined ultra-high frequency comprising: a support member; a conductive housing fixed to said member and serving as a plane of reference potential; a tuned preselector circuit mounted on said housing and tuned to said predetermined frequency; a heterodyning signal source including a tuned circuit likewise mounted on said housing; at least one of said tuned circuits comprising an elongated conductor having a length and width much greater than its thickness and formed into a single turn coil with the end surfaces thereof disposed in overlap- and with respect to one surface of said housing; a layer ping spaced parallel relation with respect to one another of insulating material interleaved between said surfaces of said coil turn and said housing; a connection extending from the innermost one of said overlapping surfaces to said housing so that said conductor and said housing conjointly define an inductor plus a pair of parallel connected tuning condensers; means for varying the spacing of said surfaces to tune said inductor; means on said support member coupled to said preselector circuit and to said heterodyning source for developing an intermediate frequency signal; and an output circuit coupled to said last mentioned means for supplying said intermediate frequency signal to an utilizing device.

References Cited in the file of this patent

UNITED STATES PATENTS

| | | |
|---|---|---|
| 2,596,117 | Bell et al. | May 13, 1952 |
| 2,677,769 | Fathauer | May 4, 1954 |

FOREIGN PATENTS

| | | |
|---|---|---|
| 796,947 | France | Feb. 3, 1936 |